(12) United States Patent
Marx et al.

(10) Patent No.: US 10,533,854 B2
(45) Date of Patent: Jan. 14, 2020

(54) METHOD FOR AUTOMATIC FREQUENCY ADAPTATION OF FILTERS DURING OPERATION IN CLOSED CONTROL LOOPS

(71) Applicant: Albert-Ludwigs-Universitat Freiburg, Freiburg (DE)

(72) Inventors: Maximilian Marx, Freiburg (DE); Daniel De Dorigo, Freiburg (DE); Yiannos Manoli, Freiburg (DE)

(73) Assignee: Albert-Ludwigs-Universitat Freiburg, Freiburg (DE)

( * ) Notice: Subject to any disclaimer, the term of this patent is extended or adjusted under 35 U.S.C. 154(b) by 318 days.

(21) Appl. No.: 15/465,216

(22) Filed: Mar. 21, 2017

(65) Prior Publication Data

US 2017/0276484 A1    Sep. 28, 2017

(30) Foreign Application Priority Data

Mar. 22, 2016    (DE) .................. 10 2016 204 683

(51) Int. Cl.
*G01R 31/00*    (2006.01)
*G01C 19/5776*    (2012.01)
*H03M 3/00*    (2006.01)

(52) U.S. Cl.
CPC ........ *G01C 19/5776* (2013.01); *H03M 3/422* (2013.01); *H03M 3/402* (2013.01); *H03M 3/43* (2013.01); *H03M 3/458* (2013.01)

(58) Field of Classification Search
USPC .... 324/76.12, 76.19, 76.28, 76.29, 674–682; 341/120; 73/854, 862.192, 862.46, 73/861.351
See application file for complete search history.

(56) References Cited

U.S. PATENT DOCUMENTS

| 3,890,570 | A | * | 6/1975 | Kristensen | ............. | G01R 23/20 |
| | | | | | | 324/76.12 |
| 6,654,424 | B1 | | 11/2003 | Thomae et al. | | |
| 7,042,375 | B1 | | 5/2006 | van Engelen | | |
| 7,324,028 | B2 | | 1/2008 | Hsieh et al. | | |

(Continued)

FOREIGN PATENT DOCUMENTS

DE    199 10 415 A1    9/2000

OTHER PUBLICATIONS

German Office Action, dated Nov. 25, 2016, 6 pages.

(Continued)

*Primary Examiner* — Vincent Q Nguyen
(74) *Attorney, Agent, or Firm* — Barley Snyder

(57) ABSTRACT

A method for adjusting the resonance frequency of a loop filter in a delta-sigma modulator includes input of a filter input signal of a loop filter into a frequency adjustment circuit and determination of a noise spectrum of the filter input signal in a first frequency band and a second frequency band. The first frequency band and the second frequency band are arranged symmetrically around the predetermined frequency. The method includes comparison of the noise spectra and creation of an adjustment signal that leads to a frequency adjustment when the noise spectra deviate from one another. The method also includes feedback of the adjustment signal of the frequency adjustment circuit to a control input of the loop filter for setting the filter frequency in response to the comparative result.

15 Claims, 9 Drawing Sheets

(56) References Cited

U.S. PATENT DOCUMENTS

| 9,130,584 | B1* | 9/2015 | Pagnanelli | H03M 3/38 |
| 2011/0063993 | A1* | 3/2011 | Wilson | G06F 3/044 |
| | | | | 370/254 |
| 2014/0060185 | A1 | 3/2014 | Rombach et al. | |
| 2017/0045360 | A1* | 2/2017 | Nakamura | H01L 29/84 |

OTHER PUBLICATIONS

M. Afifi, M. Maurer, T. Hehn, A. Taschwer, Y. Manoli, An Automatic Tuning Technique for Background Frequency Calibration in Gyroscope Interfaces based on High Order Bandpass Delta-Sigma Modulators, Department of Microsystems Engineering-IMTEK, University of Freiburg, copyright date 2015, 4 pages.

Huang, Huanzhang and Lee, Edward K.F., "Frequency and Q Tuning Techniques for Continuous-Time Bandpass Sigma-Delta Modulator", Dept. of Electrical and Computer Engineering, Iowa State University, Ames, Iowa, USA, Texas Instruments, Dallas, Texas, USA, Silicon Laboratories, Austin, Texas, USA, copyright date 2002, 4 pages.

T. Northemann, M. Maurer, S. Rombach, A. Buhmann, Y. Manoli: "Drive and sense interface for gyroscopes based on bandpass sigma-delta modulators", Proc. IEEE Int. Circuits and Systems (ISCAS) Symp, pp. 3264-3267, 2010, 4 pages.

Tsividis, Y., "Integrated continuous-time filter design—an overview," Solid-State Circuits, IEEE Journal of, vol. 29, No. 3, pp. 166,176, Mar. 1994, 11 pages.

Tsividis, Y., "Self-tuned filters," Electronics Letters, vol. 17, No. 12, pp. 406, 407, Jun. 11, 1981, 2 pages.

Huanzhang Huang; Lee, E.K.F., "Frequency and Q tuning techniques for continuous-time bandpass sigma-delta modulator," Circuits and Systems, 2002. ISCAS 2002. IEEE International Symposium on , vol. 5, pp. V-589,V-592 vol. 5, 2002, 4 pages.

Yun-Shiang Shu; Bang-Sup Song; Bacrania, K., "A 65nm CMOS CT $\Delta\Sigma$ Modulator with 81dB DR and 8MHz BW Auto-Tuned by Pulse Injection," Solid-State Circuits Conference, 2008. ISSCC 2008. Digest of Technical Papers. IEEE International, pp. 500,631, Feb. 3-7, 2008, 3 pages.

Ezekwe, C.D.; Boser, B.E., "A Mode-Matching $\Sigma\Delta$ Closed-Loop Vibratory-Gyroscope Readout Interface with a 0.004° /s/$\sqrt{HZ}$ Noise Floor over a 50Hz Band," in Solid-State Circuits Conference, 2008. ISSCC 2008. Digest of Technical Papers. IEEE International , pp. 580-637, Feb. 3-7, 2008, 3 pages.

* cited by examiner

METHOD FOR AUTOMATIC FREQUENCY ADAPTATION OF FILTERS DURING OPERATION IN CLOSED CONTROL LOOPS

CROSS-REFERENCE TO RELATED APPLICATION

This application claims the benefit of the filing date under 35 U.S.C. § 119(a)-(d) of German Patent Application No. 10 2016 204 683.7 filed Mar. 22, 2016.

FIELD OF THE INVENTION

The present invention relates to a method for automated frequency adjustment of filters during operation in closed control loops. Such filters can in particular be used advantageously during operation of angular rate sensors. Such angular rate sensors are used in driver assistance systems, navigation systems and to a growing extent in battery-powered devices such as smartphones or tablet computers.

BACKGROUND

Micro-electromechanical (MEM) Coriolis vibratory gyroscopes (CVG) have a mobile mechanical structure that is excited to perform a periodic oscillation. This periodic oscillation generated through excitation is also called primary oscillation. If the sensor undergoes a rotation around an axis perpendicular to the primary oscillation or primary movement, the movement of the primary oscillation will lead to a Coriolis force that is proportional to the measurement quantity, i.e. the angular velocity. This axis is called sensitive axis of the sensor. A second oscillation that is orthogonal to the primary oscillation is triggered by the Coriolis force. This second oscillation that is orthogonal to the primary oscillation is also called secondary oscillation or secondary movement. The secondary oscillation, which is also referred to as detection oscillation, can be detected by means of different measurement methods, wherein the detected quantity is used as a measure for the angular rate that impacts on the angular rate sensor. To create the primary oscillation, thermal, piezoelectric, electrostatic and inductive methods that are known in technology are used inter alia. To detect the secondary oscillation, piezoelectric, piezoresistive or capacitive principles are state of the art.

Angular rate sensors can be implemented in different ways. However, a common aspect of all angular rate sensors is that they comprise an oscillation device through which a primary excitation device can be set to perform the primary movement and that they have a secondary recording device that can measure a secondary movement due to an angular rate that impacts on the angular rate sensor. In case of non-decoupled sensors, the same oscillating mass performs both the primary movement as well as the secondary movement. This oscillation device is then formed in a way that it comprises a mass that is suspended flexibly in both the x-direction as well as in the y-direction. Without restricting the generality, it is assumed that the x-direction is the direction of the primary movement or of the primary oscillation, and that the y-direction is the direction of the secondary movement and/or of the secondary oscillation and that the angular rate impacts on the oscillation device in the z-direction.

The oscillation device is usually divided into a primary oscillator and a secondary oscillator. The primary oscillator performs an oscillation in the primary direction and is coupled with the secondary oscillator in a way that the primary oscillation is transferred to the secondary oscillator. The primary oscillator is ideally suspended on a substrate in a way that it can only move in the primary direction but not in the secondary direction. Hence and due to an angular rate, a Coriolis force that impacts on the primary oscillator does not lead to the primary oscillator being deflected in the secondary direction as this degree of movement space does not exist for the primary oscillator due to its suspension. On the other hand, the secondary oscillator is suspended in a way that it can move both in the primary direction as well as in the secondary direction. The secondary movement leads to a movement of the secondary oscillator in the secondary direction, wherein this secondary movement can be detected by the secondary detection device. Preferably, the secondary detection device is thereby formed in a way that it does not record the primary movement that the secondary oscillator performs only for the purpose of being sensitive to the Coriolis force. Moreover and to achieve an even better coupling, the connection between the primary oscillator and the secondary oscillator is formed in a way that, although the primary oscillation is transferred from the primary oscillator to the secondary oscillator, the secondary oscillation will not be transferred back onto the primary oscillator.

Angular rate sensors detect angular rates by a defined sensitive axis based on the Coriolis effect. As explained above, the angular rate sensor consists of two masses, i.e. the primary as well as the secondary mass. To be able to detect an angular rate by means of the Coriolis effect, the entire mass has to be set in motion. The primary mass, in which the secondary mass is suspended, is set to a constant oscillation, for example through electrostatic actuation with its resonance frequency. Through a rotation of the sensor around the sensitive axis, the Coriolis force $F_c$ impacts on the secondary mass orthogonally to the primary axis according to the following equation (1) so that the secondary mass will be deflected.

$$\vec{F}_c = -2m\vec{\Omega} \times \vec{v}_p \tag{1}$$

Here, m is the mass, $\Omega$ the angular rate and $v_p$ the velocity of the primary mass. The secondary mass is ideally mechanically suspended in a way that it can only deflect orthogonally to the primary oscillation. A large amplitude of the primary oscillation is desirable to achieve a high sensitivity. The primary mass is hereby usually excited resonantly and the amplitude of the oscillation is regulated by means of an automatic gain control (AGC) as known from the article T. Northemann, M. Maurer, S. Rombach, A. Buhmann, Y. Manoli: "Drive and sense interface for gyroscopes based on bandpass sigma-delta modulators", Proc. IEEE Int. Circuits and Systems (ISCAS) Symp, pages 3264-3267, 2010.

FIG. 1 schematically displays an angular rate sensor with a primary control loop for the drive and a secondary control loop for reading out the signal. To achieve a high linearity, large bandwidths and a reduced sensitivity with regard to process fluctuations, the sensors as shown in FIG. 1 are operated with feedback on both the primary as well as on the secondary side. According to the following equation (2), the impacting Coriolis force $\vec{F}_C$ is compensated in the secondary control loop through the application of a resetting capacitive force:

$$\vec{F}_C = \vec{F}_{es} \tag{2}$$

Therefore, the secondary mass remains in the resting position and the generated force $\vec{F}_{es}$ forms a direct measure for the angular rate that acts upon the system.

The required compensation signal is usually generated through embedding of the sensor into a closed control loop of a delta-sigma modulator (in the following also abbreviated as ΔΣM). FIG. 2 schematically displays a simplified block diagram of a secondary control loop for operating an angular rate sensor based on the delta-sigma modulation. This way, the output signal is digitalized directly with a high resolution and a high linearity is achieved.

ΔΣM are based inter alia on noise shaping. In this process, quantization noise $n_q$ that is formed at the output is suppressed through filters, which are provided within the modulator, in the signal band and shifted towards other frequencies. During realization of an electromagnetic ΔΣM, also an additional electronic filter for noise shaping is used frequently besides the actual mechanical sensor element $H_s(s)$. This filter $H_f(s)$ is typically formed as a band pass filter. The noise transfer function (NTF) according to the following equation (3) and the signal transfer function (STF) according to equation (4) can be derived on this basis.

$$NTF = \frac{Y}{n_q} = \frac{1}{1 + F(s)k_q H_s(s) H_f(s)} \quad (3)$$

$$STF = \frac{Y}{F_C} = \frac{k_q H_s(s) H_f(s)}{1 + F(s)k_q H_s(s) H_f(s)} \approx \frac{1}{F(s)} \quad (4)$$

Here, Y denominates the output signal of the as ΔΣM, $k_q$ a quantization constant, $F(s)$ the transfer function of the feedback, $H_f(s)$ the transfer function of the electric filter, $H_s(s)$ the transfer function of the secondary mass.

To achieve the best possible signal-to-noise ratio (SNR), the resonance frequency $f_f$ of the electric filter $H_f(s)$ has to be exactly in line with the primary resonance frequency of the angular rate sensor $f_d$ at which the angular rate signal is modulated. The typical power spectrum of the output Y of a ΔΣM is displayed in FIG. 3 for the case that the frequencies $f_d$ and $f_f$ do not match.

In particular in case of time-continuous filters $H_f(s)$, which can be implemented very energy-efficiently, strong variations of the filter resonance frequency $f_f$ result during production and under the influence of temperature changes. In addition, the primary resonance frequency $f_d$ of angular rate sensors can also vary strongly through process variations. These fluctuations lead to the sensor readout circuits having to be set initially on one hand and to fluctuations having to be neutralized during operation on the other hand.

To avoid a reduction of the SNR, the setting of the frequency $f_f$ has to be very accurate. This means that the error between the filter and the sensor resonance frequency should be lower than the bandwidth (BW) of the angular rate signal. For example, a high required relative accuracy of 0.5% results from typical values for the bandwidth BW=50 Hz and sensor resonance frequencies $f_d$=10 kHz.

Different concepts for setting a filter in a ΔΣM during operation are already known in the state of the art. The following examples thereby relate to both a purely electric ΔΣM for analog-to-digital conversion for which the problematic is very similar as well as to electromechanical ΔΣM for angular rate sensors.

For example the publication Tsividis, Y., "Integrated continuous-time filter design—an overview," *Solid-State Circuits, IEEE Journal of*, vol. 29, no. 3, pp. 166, 176, March 1994, discloses the so-called master-slave principle in which two filters that are aligned to one another as well as possible are used. The basic structure for readjustment the filter frequency with the master-slave principle is shown in FIG. 4.

A filter $H_{fs}(s)$ (slave) thereby works within the readout circuit whereas the other filter $H_{fm}(s)$ (master) can be set outside by means of the primary resonance frequency and a phase-comparing device. Based on the assumption that both filters behave equally, the signal $V_t$ can be used not only for the master filter but also for the slave filter.

This known method, however, cannot be used if the used electric filter has a considerable non-linearity. Especially time-continuous filters whose time constants are defined not by resistance or capacity conditions (RC) but by the transconductance of transistors and capacities ($G_m$-C) are a problem in this context. $G_m$-C filters are generally used because they can be implemented very energy-efficiently. However, they show a dependence of the transconductance $g_m$ (and consequently also of the resonance frequency) on the input voltage. The dependence shall be neglected for the operation within the secondary control circuit as, according to FIG. 2 and according to the following equation (5), the signal at the input of the filter $V_{filt}$ for the resonance frequency $f_f$ is suppressed by the overall control circuit with the gain of the filter $H_f(s)$:

$$V_{filt} = \frac{F_C - n_q}{\frac{1}{H_s(s) + H_f(s)}} \quad (5)$$

If however, as in case of the master-slave method, the actual frequency adjustment is performed outside of the readout loop, problems can arise. If a signal with the desired resonance frequency is applied directly to the input of such a filter, this will cause strong detuning of the filter frequency due to the high signal amplitudes in the filter and/or the high gain in case of resonance. Reliable setting will no longer be possible.

In addition, the accuracy of this known method is in particular limited to a frequently intolerable value by the restricted match of the two used filters. Furthermore, the surface requirement is relatively high for an implementation as an integrated circuit because a further analog filter is needed in addition to the circuit for the automated frequency adjustment.

Another known concept that is based on two separate filters but that requires no exact match of the filters is described in the article Afifi, M.; Maurer, M.; Hehn, T.; Taschwer, A.; Manoli, Y., "An automatic tuning technique for background frequency calibration in gyroscope interfaces based on high order bandpass Delta-Sigma modulators," *Circuits and Systems (ISCAS), 2015 IEEE International Symposium on*, pp. 1730, 1733, 24-27 May 2015, for the use in a readout circuit for angular rate sensors. As shown in FIG. 5, one filter is used within the readout circuit while the other one is set outside by means of the primary resonance frequency also this concept. In contrast to the first method, both filters, however, are replaced periodically so that the readout circuit only has to be interrupted for a short moment. At the same time, it is assumed that the filter in the readout circuit is not subjected to any significant change of the resonance frequency during a period of the replacement circuit.

This principle of the periodically replaced filters is already described in the publication Tsividis, Y., "Self-tuned filters," *Electronics Letters*, vol. 17, no. 12, pp. 406, 407, Jun. 111981, for the general application in time-continuous filters as well.

However, the same problems occur in this concept of the periodically replaced filters due to the non-linearity of the filters like in case of the master-slave concept. In addition, the filter has to be decoupled periodically and there is consequently the risk of impairment of the functionality of the secondary control circuit. Furthermore, the surface requirement in case of an implementation as an integrated circuit is relatively high also for this known arrangement as a further analog filter is needed in addition to the circuit for the automated frequency adjustment.

It is further known to examine the power of two spectral points at the output of the ΔΣM. In the publication Huanzhang Huang; Lee, E. K. F., "Frequency and Q tuning techniques for continuous-time bandpass sigma-delta modulator," *Circuits and Systems*, 2002. ISCAS 2002. IEEE International Symposium on, vol. 5, no., pp. V-589, V-592 vol. 5, 2002, the principle of a circuit for frequency adjustment of the filter in purely electric ΔΣM is described. Two different approaches for determining the noise power at the output of the modulator at two different points $f_a$ and/or $f_b$, which are located slightly above and/or below the actual signal frequency around $f_d$, are presented. As the electric filter influences the noise power differently on these discreet frequencies as a function of the position of its resonance frequency, the absolute value of the two noise powers can be used to determine whether the filter resonance frequency is too high or too low. FIG. 6a illustrates the principle based on the spectrum of the output Y of the secondary control circuit of the ΔΣM when $f_d$ and $f_f$ are matching. Accordingly, FIG. 6b shows the case of $f_f$ being too high. The discreet signal components $f_a$ and $f_b$ in the spectrum of the output Y are compared in order to estimate the current filter frequency. According to a first approach of this known solution, a discreet Fourier transformation (DFT) is formed at the points $f_a$ and $f_b$ by means of digital signal processing. This concept is displayed schematically in FIG. 7a.

According to a second approach of the publication Huanzhang Huang; Lee, E. K. F., "Frequency and Q tuning techniques for continuous-time bandpass sigma-delta modulator," *Circuits and Systems*, 2002. ISCAS 2002. IEEE International Symposium on, vol. 5, pp. V-589, V-592 vol. 5, 2002, the frequencies to be examined, as sketched in FIG. 7b, are filtered out by means of two additional digital filters with a very narrow bandwidth. Subsequently, the power of both signals is calculated and compared. A digital control unit adjusts the filter respectively according to the comparative result.

This solution is disadvantageous in cases where the readout loop has more then only one filter. This is typically the case for electromagnetic ΔΣM for angular rate sensors as also the mechanical element is used for filtering according to equation (4) besides the electric filter. As a result, the NTF and consequently the noise is determined at the output of two independent filter elements. However, it is not possible to distinguish which one of the two filters has to be set.

In addition, only two discreet frequency components, which have to be outside of the signal band, are examined in this known method. Therefore, the accuracy of the control is limited and many measurements have to be averaged. Averaging of multiple measurements, however, leads in turn to a slower progression of the frequency adjustment. In particular for applications that are exposed to fast temperature fluctuations, this can be intolerable. Even more striking is the condition that, due to the limited frequency selectivity, a signal in the signal band leads to disruptions of the filter control loop.

Further, the publication Huanzhang Huang; Lee, E. K. F., "Frequency and Q tuning techniques for continuous-time bandpass sigma-delta modulator," *Circuits and Systems*, 2002. ISCAS 2002. IEEE International Symposium on, vol. 5, pp. V-589, V-592 vol. 5, 2002, states that both implementation variants result in a similar space requirement. Taking the second variant as a basis, however, there is an equally high surface requirement with regard to the filter to be set due to two additional digital band pass filters, two multipliers and two integrators.

A further known solution is based on the input of test signals. As described in the publication Yun-Shiang Shu; Bang-Sup Song; Bacrania, K., "A 65 nm CMOS CT ΔΣ Modulator with 81 dB DR and 8 MHz BW Auto-Tuned by Pulse Injection," *Solid-State Circuits Conference*, 2008. ISSCC 2008. Digest of Technical Papers. IEEE International, pp. 500, 631, 3-7 Feb. 2008, and illustrated in FIG. 8a for an electromagnetic ΔΣM, a test signal $V_{test}$ with exactly one frequency is input into the control loop after the filter with a purely electric ΔΣM in this solution. Then, it is verified how the test signal is suppressed by the filter transfer function at the digital output Y of the modulator. Depending on the phase situation and size of the remaining test signal at the output Y, conclusions can be drawn about whether the filter resonance frequency $f_f$ is too high or too low. A digital control unit readjusts the filter accordingly. FIG. 8b shows such a known circuit for evaluating the input test signals.

The patent specification U.S. Pat. No. 7,042,375 B2 further describes a principle in which a broadband spectrum (dither) is used as a test signal $V_{test}$ instead of exactly one frequency. Evaluation of the signal at the output Y is done in a similar way as illustrated in FIGS. 7b or 8b.

The publication U.S. Pat. No. 7,324,028 B2 describes the input of test signals before or after the quantizer and in addition the bridging of individual filter elements.

Further, it is known from Ezekwe, C. D.; Boser, B. E., "A Mode-Matching ΔΣ Closed-Loop Vibratory-Gyroscope Readout Interface with a 0.004°/s/√Hz Noise Floor over a 50 Hz Band," in *Solid-State Circuits Conference*, 2008. ISSCC 2008. Digest of Technical Papers. IEEE International, vol., no., pp. 580-637, 3-7 Feb. 2008, that the test signals shall not be input in the readout loop in the way that is shown in FIG. 8a after the filter element, but ahead of the filter element $H_f(s)$. This way, not the electric filter $H_f(s)$ but the resonance frequency of the secondary mass $H_s(s)$ can be set. The particularity in this known implementation and the underlying concept from the publication DE 19910 415 A1 is that the test signals are situated differentially around the actual resonance frequency and not within the signal band. But the fundamental approach is possible for the setting of the electric filter $H_f(s)$ as well.

Also this solution is disadvantageous when the readout loop contains more than only one filter. As mentioned, this is typically the case in electromagnetic ΔΣM for angular rate sensors as also the mechanical element for filtering according to equation (4) is used besides the electric filter. As a consequence, the NTF and hence the noise at the output of two independent filter elements is determined. However, it is not possible to distinguish which one of the two filters has to be set.

A considerable disadvantage of a part of the methods using test signals is that the test signal is situated directly in the signal band and that it is never suppressed perfectly due to the limited resolution. Therefore, the remaining test signal can disrupt the operation of the actual readout loop. Furthermore, the time until the secondary control loop can be used after the start is increased in case of this method. This is because, in contrast to the other explained methods, an incorrectly set filter does not only mean in these variants that the SNR is worse but also that the test signal is not suppressed. It can therefore not be distinguished from a possible angular rate signal. In the known implementation according to Ezekwe, C. D.; Boser, B. E., "A Mode-Matching ΔΣ Closed-Loop Vibratory-Gyroscope Readout Interface with a 0.004°/s/√Hz Noise Floor over a 50 Hz Band," in *Solid-State Circuits Conference, 2008. ISSCC 2008. Digest of Technical Papers. IEEE International*, vol., no., pp. 580-637, 3-7 Feb. 2008, and DE 19910415 A1, the signals should be outside of the bandwidth of the angular rate signal. This results in a compromise between a maximum bandwidth and control accuracy.

In addition and depending on the implementation, there is a significant additional surface requirement for the generation of the test signals and the input into the readout loop besides the surface requirement for the evaluation of the test signals so that a disadvantageously high surface requirement shall be assumed for an implementation as an integrated circuit.

None of the solutions known so far consequently fulfills all requirements for an automated frequency adjustment of electric filters during operation in closed control loops with regard to applicability, functionality, and surface requirement of an implementation as an integrated circuit.

SUMMARY

There is consequently a need for an improved method for automated frequency adjustment of filters that enables a reliable high-resolution detection of an angular rate signal.

For this purpose, the required initial setting and/or continuous readjustment of the electric filter element in a closed readout loop as illustrated in FIG. 2 has to be performed. The frequency adjustment should take place at a minimum possible use of energy and space as well as with a short starting time. The circuit has to adjust the resonance frequency $f_f$ of the electric filter $H_f(s)$ to the primary resonance frequency of the sensor $f_d$ during operation of the readout circuit and without interrupting said readout circuit. Therefore, occurring changes in the resonance frequencies $f_d$ or $f_f$, e.g. due to a temperature change, are compensated. This implies that the adjustment process must not be disrupted by possible angular rate signals. In addition, the frequency adjustment must not be influenced by the mechanical transfer function of the sensor element $H_s(s)$. The maximum deviation between $f_d$ and $f_f$ has to be in the range of the bandwidth of the angular rate signal.

This problem is solved by the object of the independent claim. Advantageous further developments of the present invention are the subject matter of the dependent claims.

The present invention is based on the idea of providing a system for frequency adjustment of the electric filter $H_f(s)$ that has a first component for rough initial alignment of the frequencies $f_f$ with $f_d$ and a second component for frequency adjustment that works in the background during operation.

The component for rough alignment is in particular required to balance the fluctuations during production of the angular rate sensor and therefore the variation of the primary resonance frequency $f_d$. For this purpose, the control signal of the oscillator that exists in the primary control loop is used. This oscillator is aligned by the components within the primary control loop to the primary resonance frequency of the angular rate sensor. Through an alignment of the control characteristic of the oscillator with the frequency control of the electric filter in the secondary control loop, a rough alignment of the frequencies can consequently occur in a similar way as in the master-slave principle described above. However, no additional filter and generally only a very low additional switching effort are in particular required in contrast to the known solution.

The frequency adjustment that runs additionally in the background is necessary to achieve the required high accuracy. The principle of frequency adjustment is based on the evaluation of the noise formation of the closed control loop at the input of the electric filter $V_{filt}$ in a differential band around the primary resonance frequency $f_d$.

For better understanding of the present invention, said invention will be described in greater detail based on the embodiments illustrated in the following FIGS. Identical parts are thereby denominated with identical reference signs and identical component names. Furthermore, individual features or combinations of features of the shown and described embodiments can also be independent inventive or invention-based solutions in isolation.

DETAILED DESCRIPTION OF THE EMBODIMENT(S)

An advantageous embodiment of the present invention will be described in the following with reference to the FIGS. 9 and 10. According to the present invention, the signal $V_{filt}$ that was input in the loop filter is tapped and input in a frequency adjustment circuit 100 for adjusting the filter frequency $f_f$ of the loop filter $H_f(s)$ 110 to the resonance frequency $f_d$ of the primary oscillation. In the displayed embodiment, the system for frequency adjustment of the electric filter $H_f(s)$ comprises a component for rough initial alignment of the frequencies $f_f$ with $f_d$ and a component for frequency adjustment that works in the background during operation.

The component for rough alignment is in particular necessary to balance the fluctuations during production of the angular rate sensor and therefore the variation of the primary resonance frequency $f_d$. For this purpose, the control signal of the oscillator of the phase-locked loop (PLL) that exists in the primary control loop is used. This oscillator is aligned by the components within the primary control loop with the primary resonance frequency of the angular rate sensor. Through an alignment of the control characteristic of the oscillator with the frequency control of the electric filter in the secondary control loop, a rough alignment of the frequencies $f_f$ and $f_d$ can therefore take place for example at the start of the operation.

To reach the required accuracy, the present invention suggests a frequency adjustment that runs in the background in addition. The principle of frequency adjustment according to the invention is thereby based on an evaluation of the noise formation of the closed control loop at the input of the electric filter $V_{filt}$ in a differential band around the primary resonance frequency $f_d$.

Figure 9A:
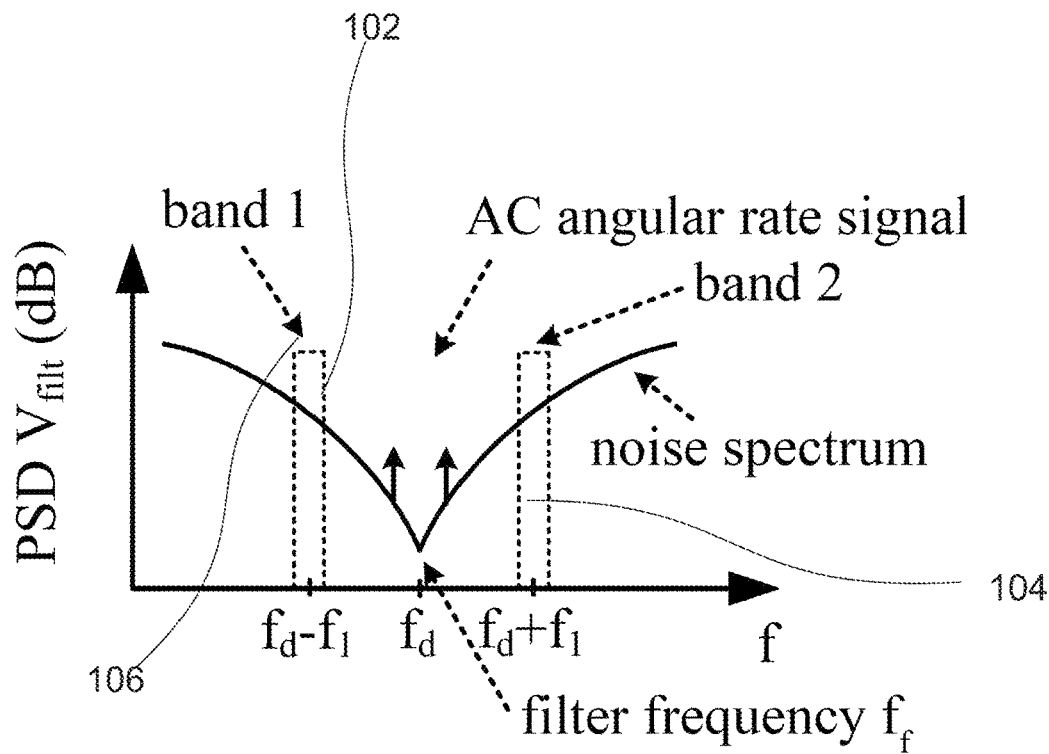
FIG. 9a a graph of the spectral power density of the input of the electric filter of the secondary control loop as well as the frequency bands evaluated according to the invention in case of a match between the primary resonance frequency and the filter frequency of the loop filter.
Figure 9B:
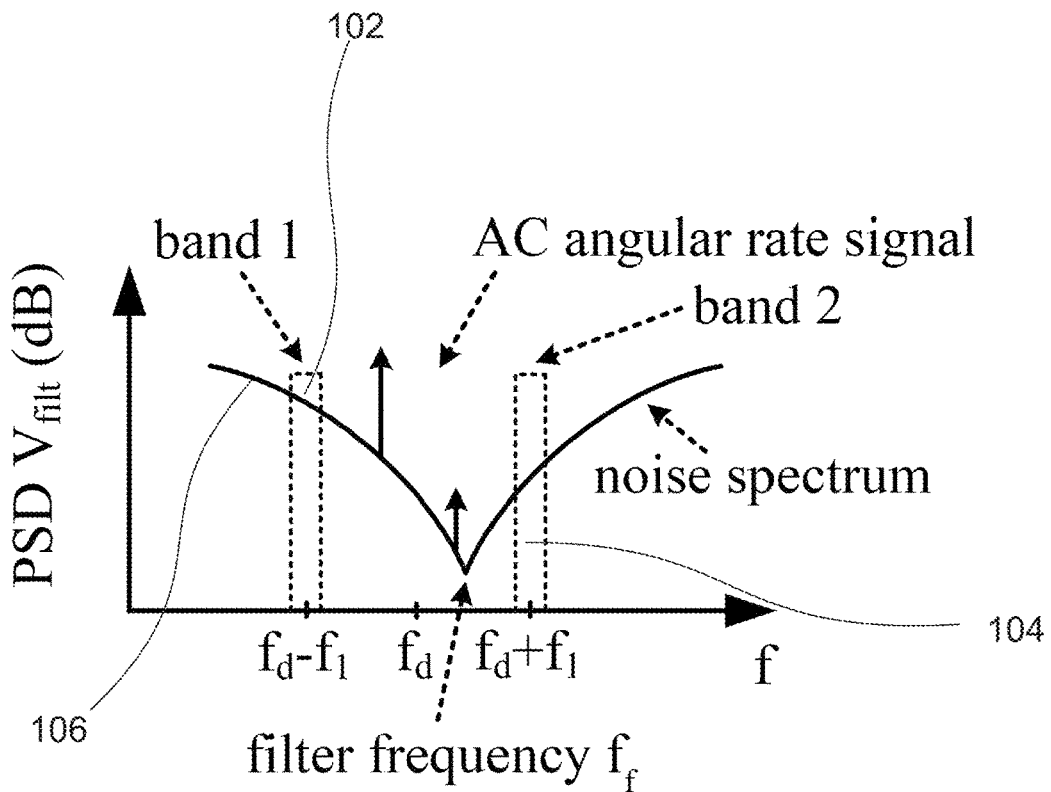
FIG. 9b a graph of the spectral power density of the input of the electric filter of the secondary control loop as well as the frequency bands according to the invention in case of incorrect adjustment between the primary resonance frequency and the filter frequency of the loop filter.

FIGS. 9a and 9b show the spectrum (power density spectrum, PSD) of the signal $V_{filt}$ as a function of the frequency f. FIG. 9a thereby displays the frequency components for $f_d=f_f$ schematically whereas FIG. 9b refers to the case in which $f_d<f_f$ applies. According to the invention, the values for the power density spectrum of the signal $V_{filt}$ are compared to one another respectively in a first frequency band 102 and in a second frequency band 104 that are arranged symmetrically around the resonance frequency $f_d$. In the case of $f_d=f_f$ the curve 106 is symmetrical in relation to the resonance frequency $f_d$ of the primary oscillation and the difference of the values for the power density spectrum of the signal $V_{filt}$ disappears. On the other hand, the curve 106 is asymmetric in relation to the resonance frequency $f_d$ of the primary oscillation in case of $f_d \neq f_f$. FIG. 9b shows the case of $f_d<f_f$. For a too low filter frequency, the position of the frequency bands 102, 104 is shifted respectively in the other direction in relation to the curve 106.

If a difference signal is formed in this case, said signal will not be equal to zero and can be used to generate an adjustment signal for the control input of the loop filter. By means of this comparison, the position of the current filter frequency can consequently be estimated with reference to the resonance frequency of the primary oscillation.

Figure 1:
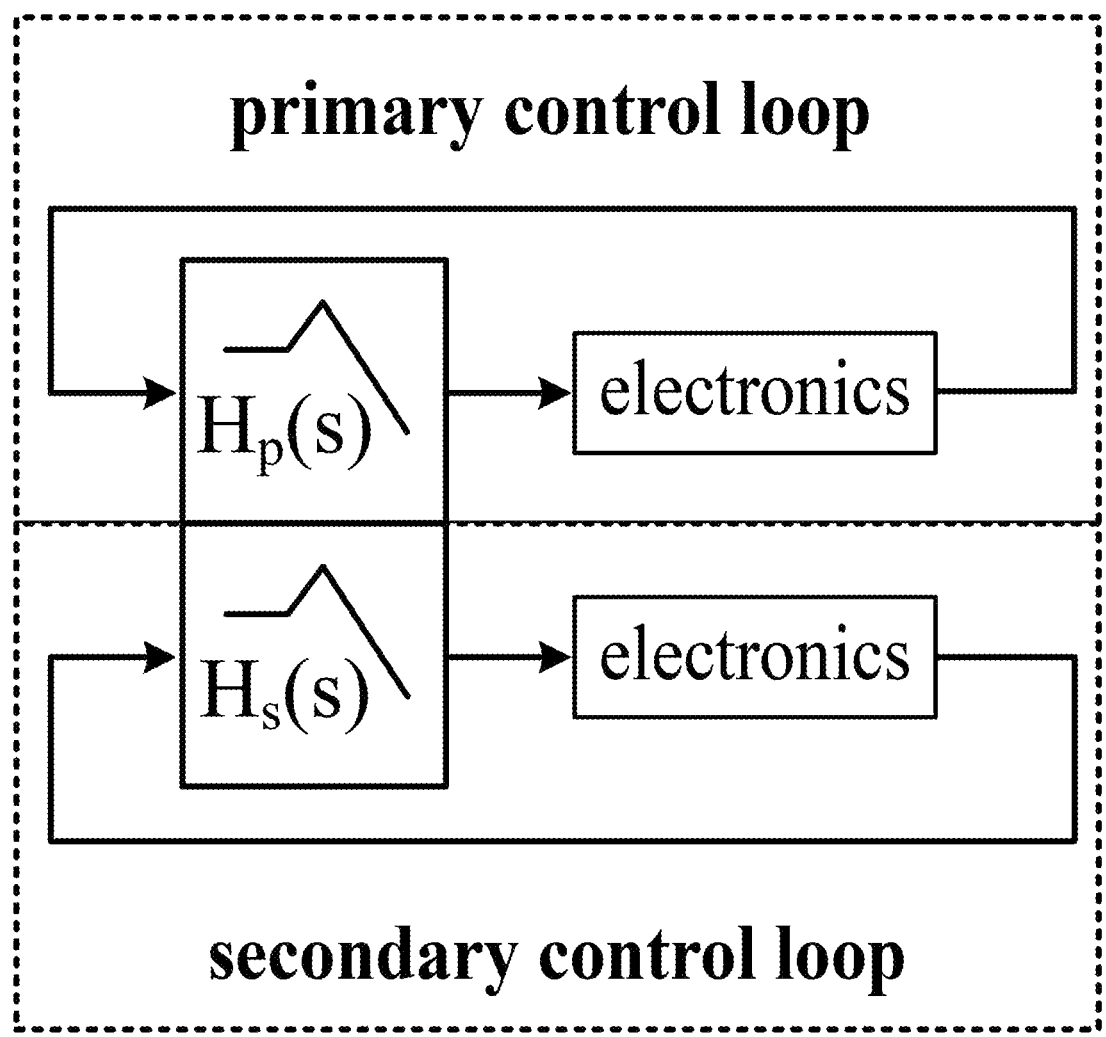
FIG. 1 a schematic diagram of an angular rate sensor based on the Coriolis effect.
Figure 2:
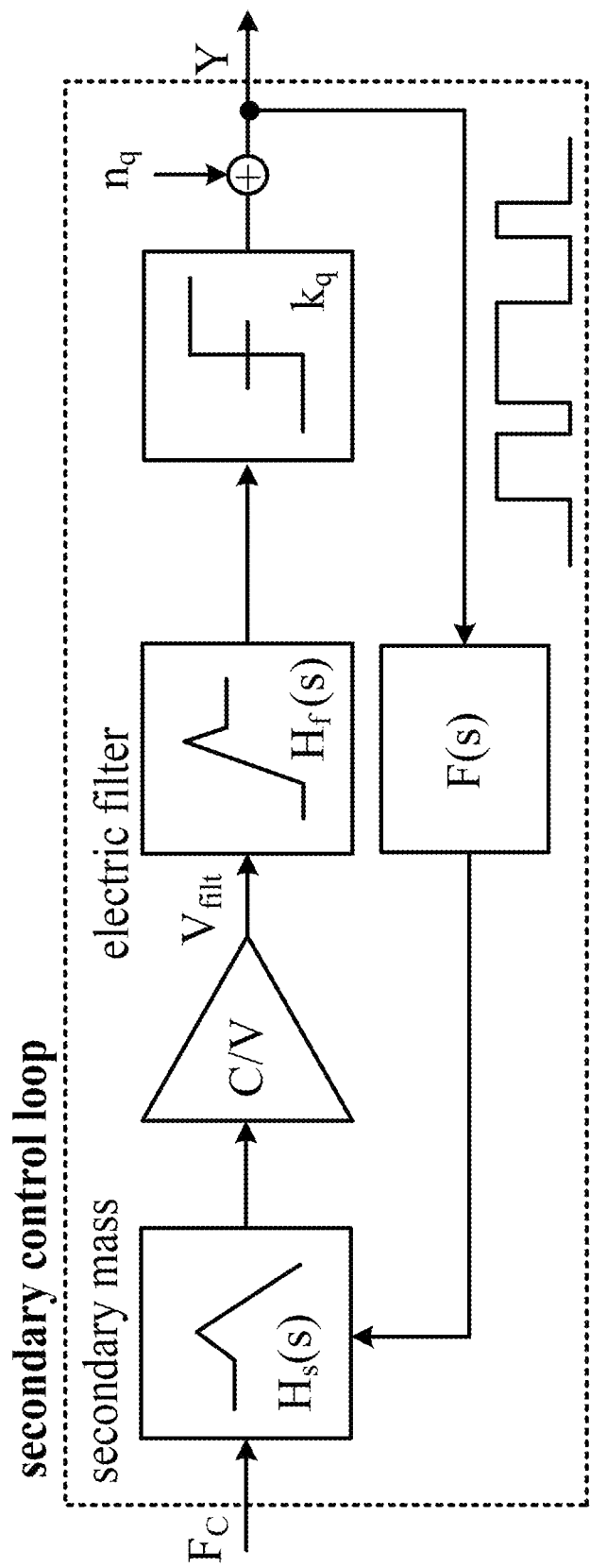
FIG. 2 a schematic diagram of a secondary control loop based on the principle of delta-sigma modulation for the operation of an angular rate sensor.
Figure 3:
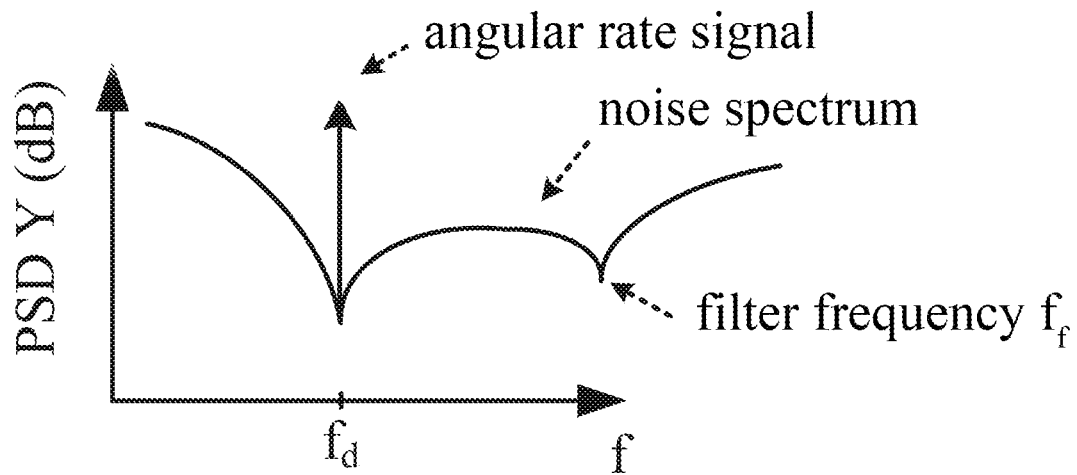
FIG. 3 a graph of the spectral power density of the output of the secondary control loop in case of an incorrect adjustment between the primary resonance frequency and the filter frequency of the loop filter.
Figure 4:
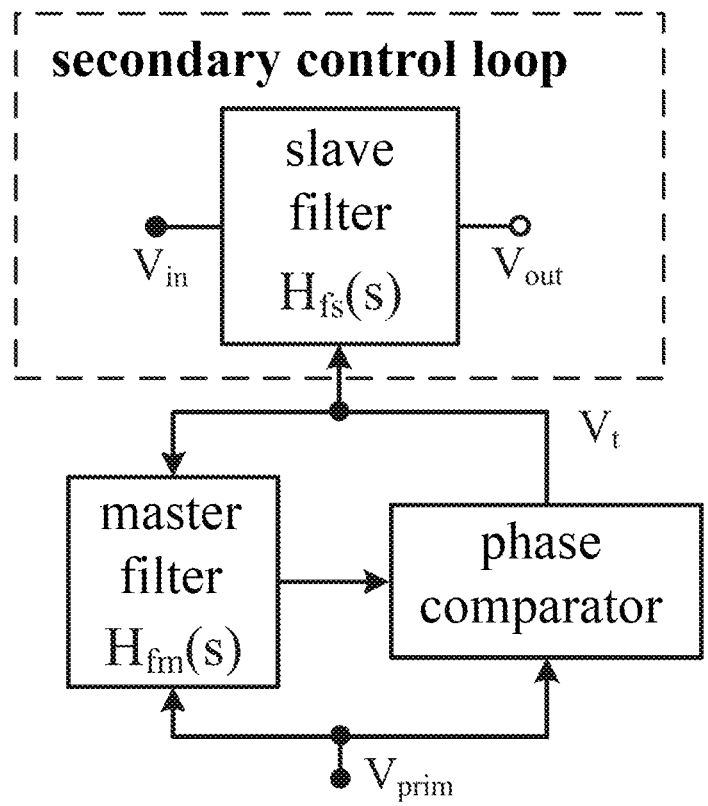
FIG. 4 a first known arrangement for readjustment of the filter frequency.
Figure 5:
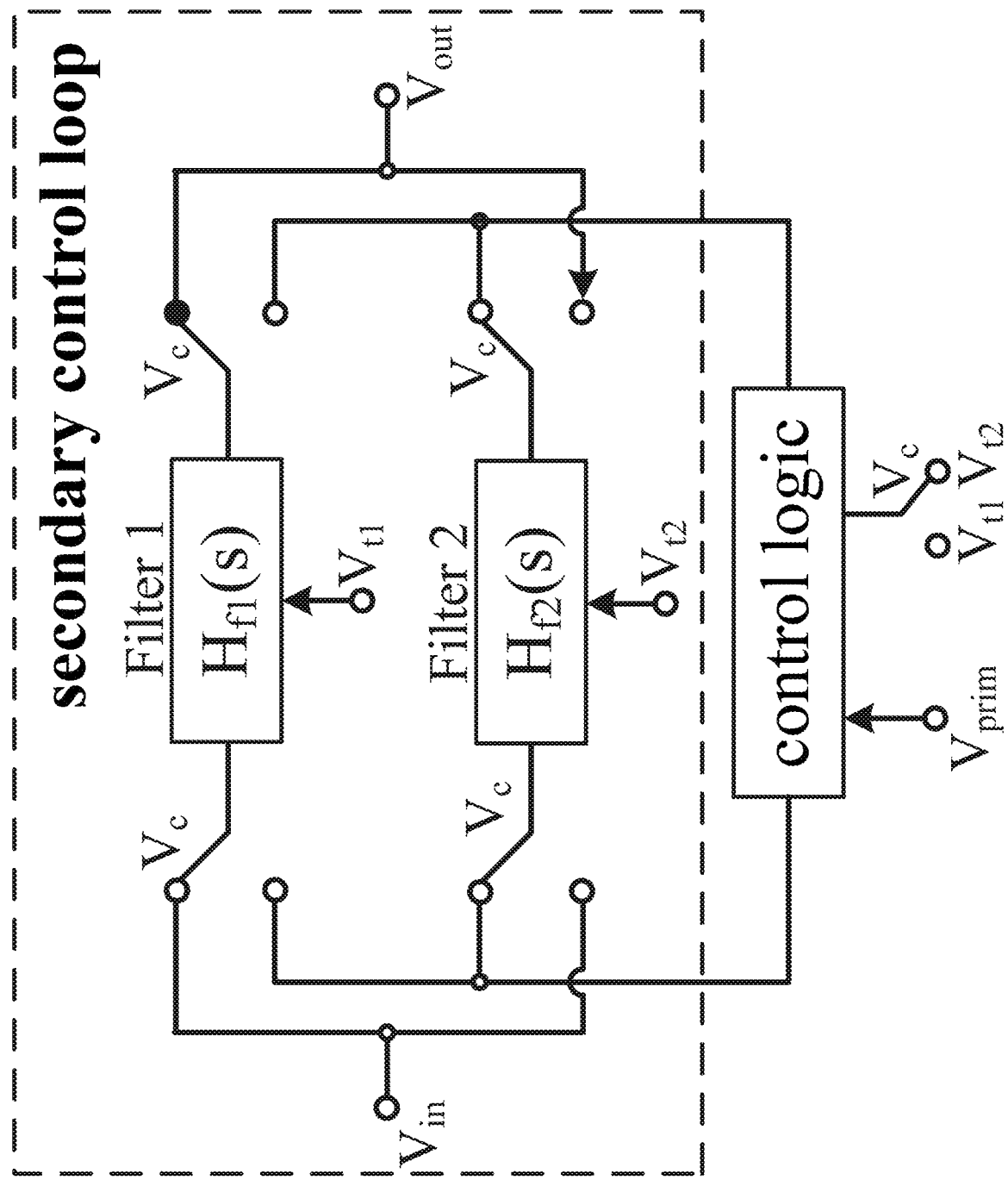
FIG. 5 a second known arrangement for readjustment of the filter frequency.
Figure 6A:
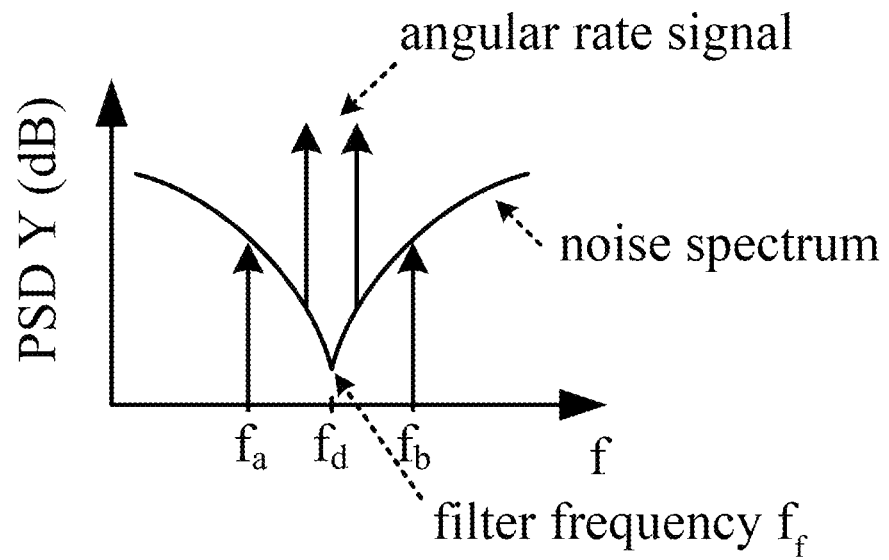
FIG. 6a a graph of the spectral power density of the output of the secondary control loop in case of a match between the primary resonance frequency and the filter frequency of the loop filter.
Figure 6B:
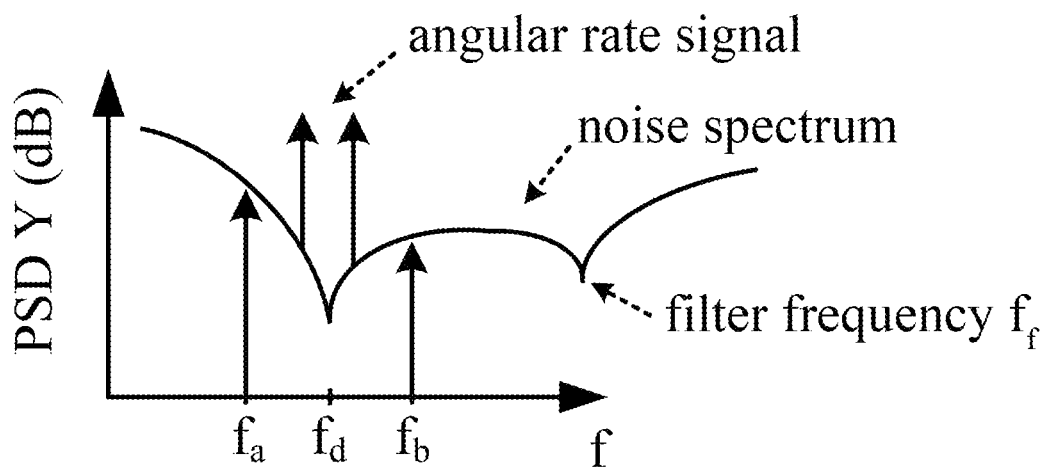
FIG. 6b a graph of the spectral power density of the output of the secondary control loop in case of incorrect adjustment between the primary resonance frequency and the filter frequency of the loop filter.
Figure 7A:
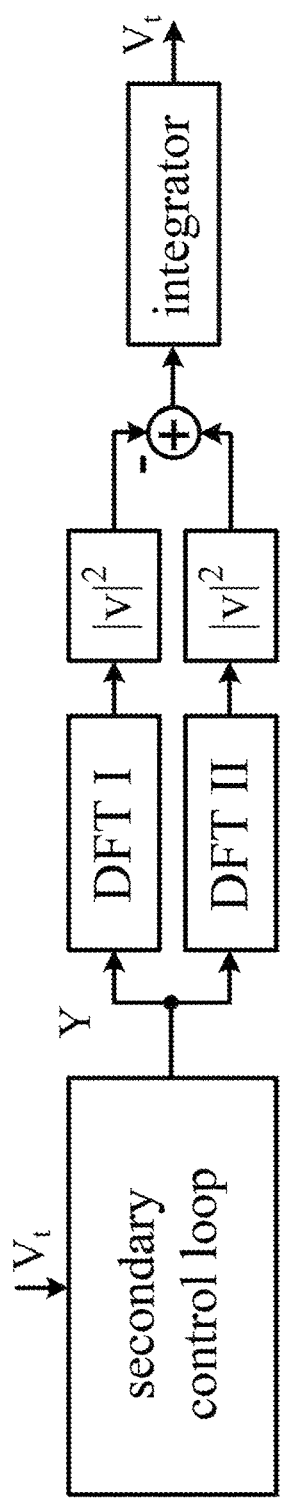
FIG. 7a a further known arrangement for readjustment of the filter frequency.
Figure 7B:
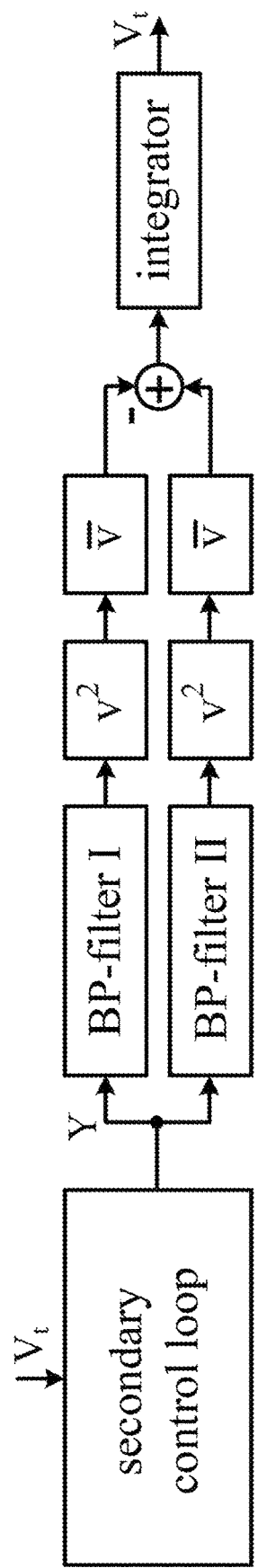
FIG. 7b a further known arrangement for readjustment of the filter frequency.
Figure 8A:
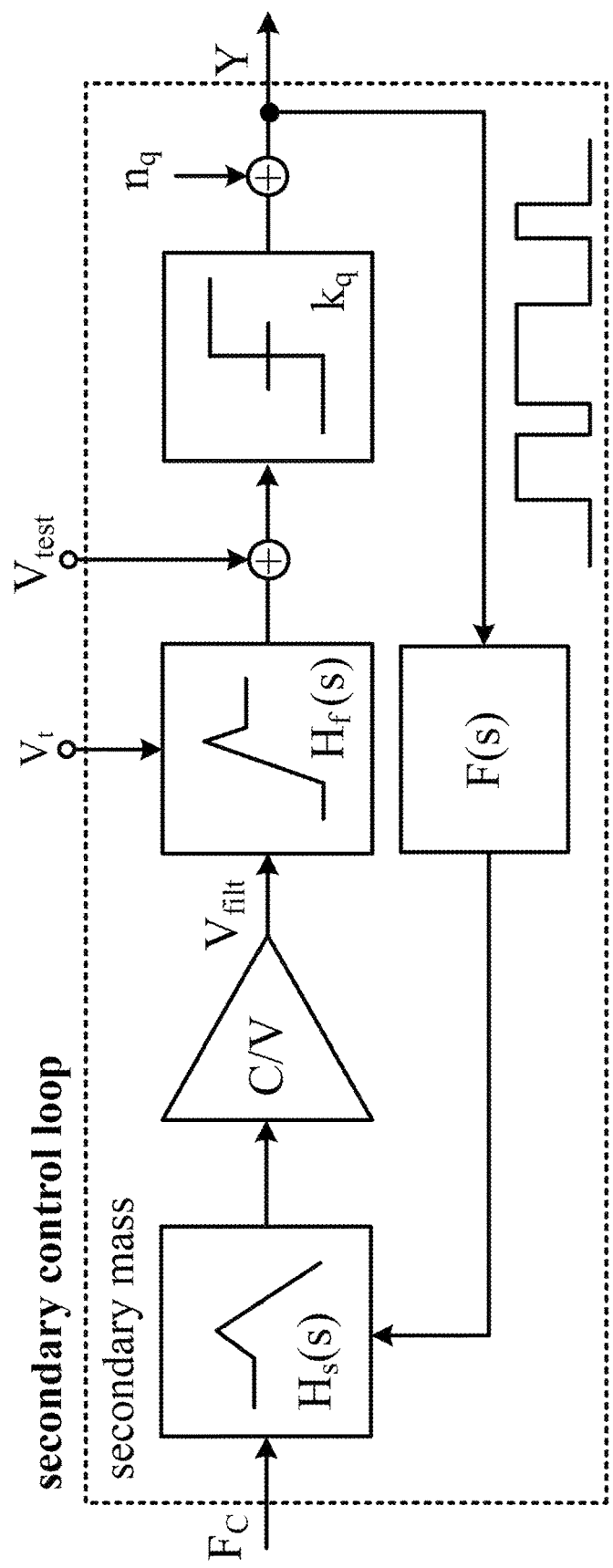
FIG. 8a a schematic diagram of a secondary control loop with input test signals.
Figure 8B:
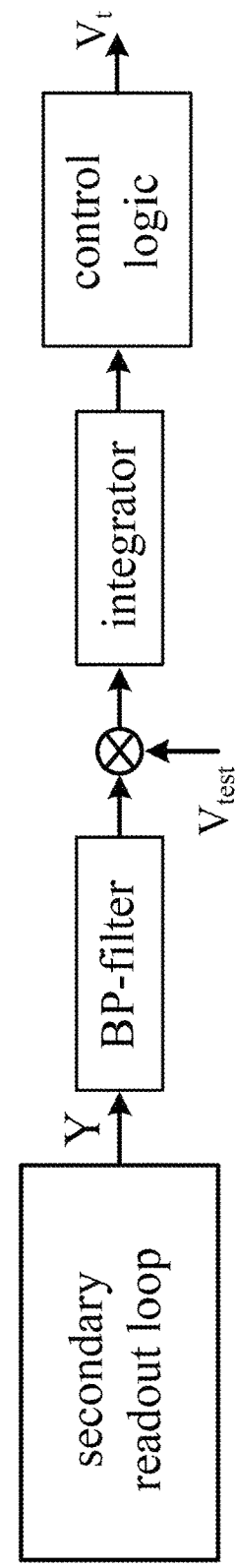
FIG. 8b a schematic diagram of a circuit for evaluating the test signals that were input in the secondary control loop.

As already explained with reference to FIG. 2 above, the signal $V_{filt}$ as described by the equation (5) depends on the Coriolis force $F_C$, the quantization noise $n_q$ as well as the filter functions $H_s(s)$ and $H_f(s)$ of the secondary mass and/or of the loop filter.

Contrary to the output signal Y of the ΔΣM, both the quantization noise $n_q$ as well as the angular rate signal $F_c$ are suppressed by the electric filter $H_f(s)$ in an advantageous way at the input of the electric filter $V_{filt}$.

The system is further based on the idea of demodulating the bands 102, 104 displayed in FIG. 9 individually into the base band to subsequently compare the overall noise and/or signal power in the two bands. This allows for an accurate determination of whether the current filter frequency is too high or too low.

Due to this differential approach in the frequency range, also an angular rate signal that is not completely suppressed and still existing does not cause any disruption of the setting process. Respectively one component emerges in band 102 and/or band 104 due to the two side bands of the amplitude-modulated angular rate signal. As the filter according to the above equation (5) suppresses the angular rate signal $F_c$ in the same way as the quantization noise $n_q$, the angular rate signal can consequently also be used for control.

Figure 10:
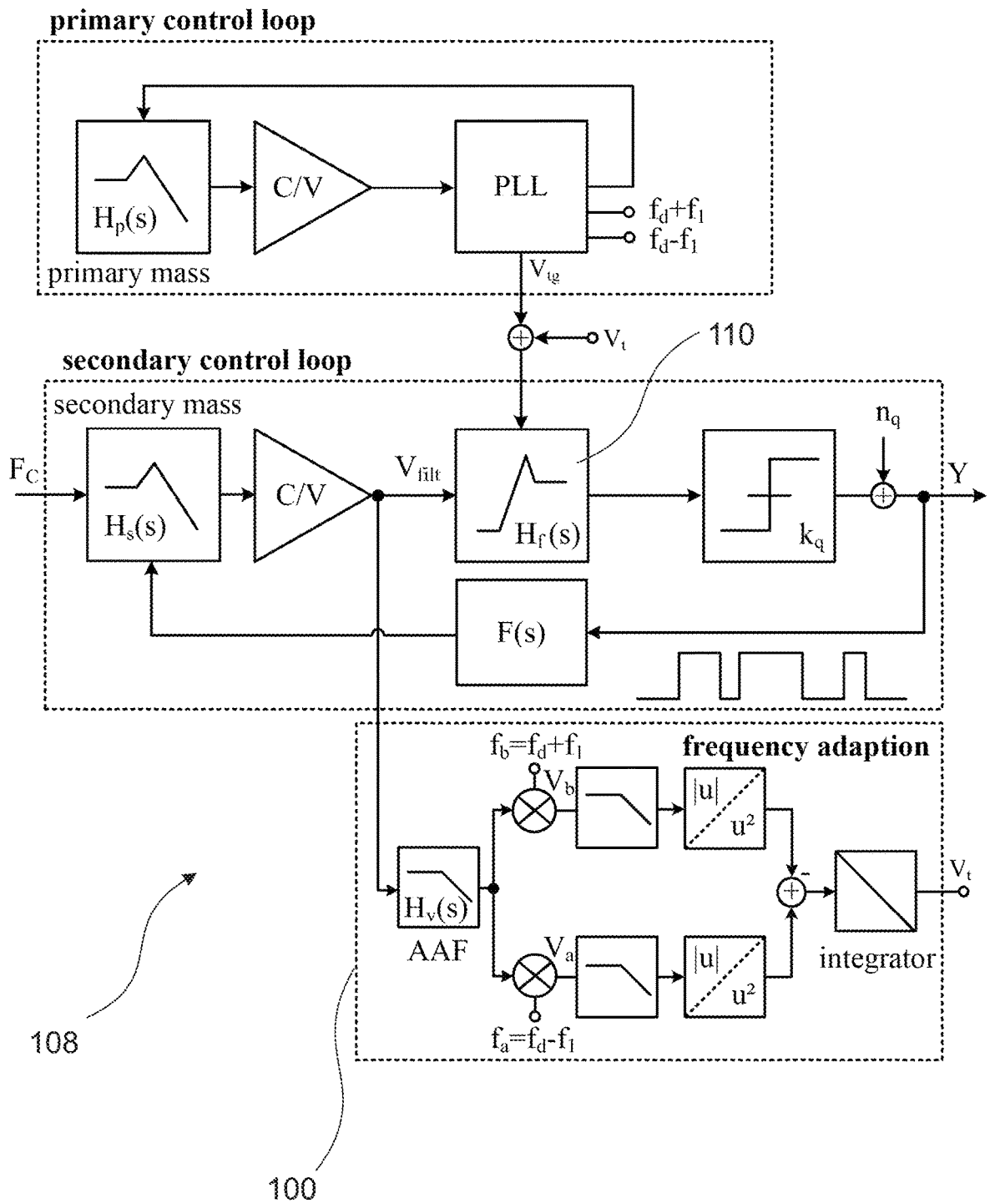
FIG. 10 a schematic diagram of an angular rate sensor based on the Coriolis effect with a frequency adjustment circuit according to an exemplary embodiment of the present invention.

FIG. 10 shows the fundamental structure of an angular rate sensor 108 with the automated frequency adjustment according to the invention of the loop filter 110 of the secondary control loop according to an advantageous embodiment.

For rough alignment of the frequency $f_f$ of the electric filter 110 [with the transfer function $H_f(s)$] with the primary resonance frequency $f_d$, a signal $V_{tg}$, which is proportional to the control signal of the oscillator in the phase-locked loop (PLL) of the primary control loop, is generated. This signal is offset (for example through addition) with the control signal $V_t$ of the frequency adjustment.

To determine the current frequency of the electric filter based on the noise formation, the signal $V_{filt}$ is at first pre-amplified with $H_v(s)$ and frequencies that are clearly above the primary resonance frequency $f_d$ are suppressed. In the next step, the signal is demodulated by means of two multipliers and the frequencies $f_{a,b}=f_d \pm f_1$ in order to evaluate the resulting base band signals further.

The required frequencies $f_{a,b}$ can be generated accurately in a very simple way and show a negative ($f_a$) and/or positive ($f_b$) frequency shift towards the primary resonance frequency $f_d$. Through multiplication, we consequently obtain signals with frequencies that were previously above and/or below $f_d$ by $f_1$ and subsequently at 0 Hz. This enables a very easy removal of other signal components with successive low-pass filters. The frequencies $f_{a,b}$ can be applied to the multipliers either by means of sine-shaped voltages or, in order to reduce the complexity, by means of square-wave voltages.

In the following step, either the power and/or signal strength of both signals is measured through squaring or through formation of absolute values and subsequently the difference is formed. The difference variable is used as an error variable for a control device that advantageously has a I-portion. The control device can thereby either be operated continuously or reset periodically in connection with a plus/minus sign evaluation and a digital logic.

The value for the regulating variable $V_t$ obtained after the first adjustment can be saved in an advantageous way in order to obtain the right frequency $f_f$ faster after a subsequent start. For this purpose, the frequency adjustment circuit 100 can have an appropriate memory device.

The principle for initial alignment according to the invention uses the oscillator, which already exists in the primary control loop, and consequently requires only a minimal additional switching effort in contrast to the known arrangements. In addition, the accuracy to be achieved through the additional circuit for adjustment of the frequencies has to be only in the range of approximately 10% of the primary resonance frequency.

In contrast to the known methods, the principle for adjustment of the frequencies according to the invention also allows for the adjustment of strongly non-linear filters (such as Gm-C filters) during operation. In addition, there is no dependence on the sensor transfer function in contrast to the known methods.

Due to the closed control loop used, there is no requirement for the circuit to align specific components particularly well to the actual filter in case of the frequency adjustment according to the present invention. In addition, a significantly faster and more accurate frequency adjustment than in case of examining discreet signal components in the spectrum of the output Y of the secondary control loop is reached through the integration of a large noise signal band. As no additional signals whatsoever need to be input in the secondary control loop or as the secondary control loop has to be disconnected for a short time, no impairment of the functionality for signal readout can occur.

Due to the simple components that are to be implemented very efficiently in the analog domain, the estimated surface requirement of the suggested implementation is significantly lower than in the solutions according to the current state of the art.

In sum, the low surface requirement allows for the realization of a more cost-efficient system with reduced energy consumption through the insertable Gm-C filters and a higher accuracy than with known arrangements.

The scope of application of the present invention, however, is not limited to angular rate sensors. In addition, the invention is also applied for the operation of other sensors such as acceleration sensors. Furthermore, in particular the frequency adjustment during operation can also be applied in analog-to-digital converters with closed control loops (e.g. $\Delta\Sigma M$ ADC). Besides, the concept can be applied for any type of filters in which a broadband excitation of the filter occurs and therefore in which the transfer function of the filter is depicted in an approximate way based on one of the signals in the application.

The invention claimed is:

1. A method for adjusting the resonance frequency of a loop filter in a delta-sigma modulator to a predetermined frequency value, wherein the delta-sigma modulator comprises:
   an input terminal that is connected to the loop filter, a quantizer that is connected to an output of the loop filter, and a feedback branch that couples an output of the quantizer back to the input terminal, wherein the method comprises the following steps:
   inputting a filter input signal of the loop filter into a frequency adjustment circuit, determining a noise spectrum of the filter input signal in a first frequency band and a second frequency band, wherein the first frequency band and the second frequency band are arranged symmetrically around the predetermined frequency, comparing the noise spectra and generating an adjustment signal that causes a frequency adjustment when the noise spectra deviate from one another, and feeding back the adjustment signal of the frequency adjustment circuit to a control input of the loop filter for setting the filter frequency in response to the comparative result.

2. The method according to claim 1, wherein the first and the second frequency band are each demodulated into a base band for comparing the noise spectra and wherein the overall noise power in the two frequency bands is compared.

3. The method according to claim 1, further comprising the step of an initial adjustment of the resonance frequency of the loop filter through entry of the predetermined frequency value as a starting value.

4. A delta-sigma modulator with an input terminal that is connected to the loop filter, a quantizer that is connected to an output of the loop filter, and a feedback branch that couples an output of the quantizer back to the input terminal, wherein the delta-sigma modulator further comprises:
   a frequency adjustment circuit whose input is connected to an input of the loop filter for receiving a filter input signal of the loop filter and whose output is coupled back to a control input of the loop filter, wherein the frequency adjustment circuit has a first and a second demodulator branch that are operated to determine a noise spectrum of the filter input signal in a first frequency band and a second frequency band, wherein the first frequency band and the second frequency band are arranged symmetrically around the predetermined frequency, and wherein the frequency adjustment circuit further has a comparative unit that is operated to compare the noise spectra and to generate an adjustment signal, which causes a frequency adjustment when the noise spectra deviate from one another, at the output of the frequency adjustment circuit.

5. The delta-sigma modulator according to claim 4, wherein the frequency adjustment circuit further comprises a pre-amplifier for amplifying the filter input signal that is arranged between the input of the frequency adjustment circuit and the demodulator branches.

6. The delta-sigma modulator according to claim 4, wherein the first demodulator branch has a first multiplier that is operated to multiply the filter input signal with a first comparative frequency that is lower than the predetermined frequency value, wherein the second demodulator branch has a second multiplier that is operated to multiply the filter input signal with a second comparative frequency that is higher than the predetermined frequency value and wherein the first and the second comparative frequencies are arranged symmetrically around a predetermined frequency value.

7. The delta-sigma modulator according to claim 4, wherein each of the demodulator branches has at least one filter element.

8. The delta-sigma modulator according to claim 4, wherein each of the demodulator branches has a squaring device that is connected to an adding device to determine a difference of the signals that are applied to the outputs of the squaring devices and to output a difference value.

9. The delta-sigma modulator according to claim 4, wherein each of the demodulator branches respectively has an absolute value element for determining an absolute value and the outputs of the absolute values are connected to an adding device to determine a difference of the signals that are applied to the outputs of the absolute value elements and to output a difference value.

10. The delta-sigma modulator according to claim 8, further comprising a control unit that is impinged with the difference value and that creates the adjustment signal based on said difference value.

11. A circuit arrangement for reading out of a capacitive angular rate sensor with at least one primary mass and at least one secondary mass that is connected to the primary mass, wherein the primary mass is excited to a primary oscillation during operation and wherein the secondary mass is deflected from a resting position in a direction that is transversal to the primary oscillation when the angular rate sensor rotates around a sensitive axis that is transversal to the direction of the primary oscillation and to the direction of the deflection of the secondary mass, wherein the circuit arrangement comprises:

a delta-sigma modulator with at least one control loop to perform a force feedback that resets the secondary mass into its resting position by means of applying a reset signal, wherein the reset signal forms a modulator output signal of the delta-sigma modulator, wherein the delta-sigma modulator is formed by a delta-sigma modulator according to claim 4 and wherein the predetermined frequency value is the frequency of the primary oscillation, a control unit for calculating and outputting an angular rate signal out of the modulator output signal.

12. The circuit arrangement according to claim 11, wherein the frequency of the primary oscillation is controlled by means of a closed phase-locked control loop that has an oscillator, and wherein the phase-locked control loop is connected to a control input of the loop filter for receiving a control signal of the oscillator.

13. The circuit arrangement according to claim 12, wherein the phase-locked control loop outputs a first and a second comparative frequency to the frequency adjustment circuit.

14. The circuit arrangement according to claim 11, further comprising a memory device for saving the adjustment signal.

15. A coriolis angular rate sensor with at least one primary mass and at least one secondary mass that is connected to the primary mass, wherein the primary mass is excited to perform a primary oscillation during operation and wherein the secondary mass is deflected in a direction that is transversal to the primary oscillation when the Coriolis angular rate sensor rotates around a sensitive axis, wherein the Coriolis angular rate sensor has a circuit arrangement according to claim 11 for reading out an angular rate signal.

* * * * *